(12) United States Patent
Dasgupta et al.

(10) Patent No.: US 9,099,490 B2
(45) Date of Patent: Aug. 4, 2015

(54) SELF-ALIGNED STRUCTURES AND METHODS FOR ASYMMETRIC GAN TRANSISTORS AND ENHANCEMENT MODE OPERATION

(71) Applicants: Sansaptak Dasgupta, Santa Clara, CA (US); Han Wui Then, Portland, OR (US); Marko Radosavljevic, Beaverton, OR (US); Niloy Mukherjee, Beaverton, OR (US); Niti Goel, Austin, TX (US); Sanaz Kabehie, Portland, OR (US); Seung Hoon Sung, Beaverton, OR (US); Ravi Pillarisetty, Portland, OR (US); Robert S. Chau, Beaverton, OR (US)

(72) Inventors: Sansaptak Dasgupta, Santa Clara, CA (US); Han Wui Then, Portland, OR (US); Marko Radosavljevic, Beaverton, OR (US); Niloy Mukherjee, Beaverton, OR (US); Niti Goel, Austin, TX (US); Sanaz Kabehie, Portland, OR (US); Seung Hoon Sung, Beaverton, OR (US); Ravi Pillarisetty, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 133 days.

(21) Appl. No.: 13/631,534

(22) Filed: Sep. 28, 2012

(65) Prior Publication Data
US 2014/0091308 A1 Apr. 3, 2014

(51) Int. Cl.
*H01L 29/66* (2006.01)
*H01L 29/778* (2006.01)
*H01L 29/423* (2006.01)
*H01L 29/08* (2006.01)
*H01L 29/20* (2006.01)

(52) U.S. Cl.
CPC ...... *H01L 29/66462* (2013.01); *H01L 29/7787* (2013.01); *H01L 29/0847* (2013.01); *H01L 29/2003* (2013.01); *H01L 29/42376* (2013.01)

(58) Field of Classification Search
USPC .......................... 257/194, E21.403, E29.246
See application file for complete search history.

(56) References Cited

U.S. PATENT DOCUMENTS

| 2008/0251877 | A1 | 10/2008 | Jain et al. | |
| 2010/0123204 | A1 | 5/2010 | Shin | |
| 2010/0301395 | A1 | 12/2010 | Xu et al. | |
| 2012/0021572 | A1 | 1/2012 | Mizuno | |
| 2012/0034954 | A1* | 2/2012 | Tabe | 455/566 |
| 2014/0015066 | A1* | 1/2014 | Wu et al. | 257/392 |

FOREIGN PATENT DOCUMENTS

JP    2009-135399 A    6/2009

OTHER PUBLICATIONS

International Preliminary Report and Written Opinion for PCT/US2013/045427, International Filing Date Jun. 12, 2013, mailing date Apr. 9, 2015, 7 pages.

* cited by examiner

*Primary Examiner* — David Vu
*Assistant Examiner* — Brandon Fox
(74) *Attorney, Agent, or Firm* — Blakely, Sokoloff, Taylor & Zafman LLP

(57) ABSTRACT

Embodiments include high electron mobility transistors (HEMT). In embodiments, a gate electrode is spaced apart by different distances from a source and drain semiconductor region to provide high breakdown voltage and low on-state resistance. In embodiments, self-alignment techniques are applied to form a dielectric liner in trenches and over an intervening mandrel to independently define a gate length, gate-source length, and gate-drain length with a single masking operation. In embodiments, III-N HEMTs include fluorine doped semiconductor barrier layers for threshold voltage tuning and/or enhancement mode operation.

17 Claims, 8 Drawing Sheets

US 9,099,490 B2

SELF-ALIGNED STRUCTURES AND METHODS FOR ASYMMETRIC GAN TRANSISTORS AND ENHANCEMENT MODE OPERATION

TECHNICAL FIELD

Embodiments of the present invention generally relate to microelectronic devices, and more particularly to group III-N transistor architecture and fabrication.

BACKGROUND

The mobile computing (e.g., smart phone and tablet) markets benefit from smaller component form factors and lower power consumption. Because current platform solutions for smart phones and tablets rely on multiple packaged integrated circuits (ICs) mounted onto a circuit board, further scaling to smaller and more power efficient form factors is limited. For example, a smart phone will include a separate power management IC (PMIC), radio frequency IC (RFIC), and WiFi/Bluetooth/GPS IC, in addition to a separate logic processor IC. System on Chip (SoC) architectures offer the advantage of scaling which cannot be matched by board-level component integration. While the logic processor IC may itself be considered a system on a chip (SoC) integrating both memory and logic functions, more extensive SoC solutions for mobile computing platforms have remained elusive because the PMIC and RFIC operate with two or more of high voltage, high power, and high frequency.

While an SoC solution for the mobile computing space that would integrate PMIC and RFIC functions is attractive for improving scalability, lowering costs, and improving platform power efficiency, one barrier to such an SoC solution is the lack of a scalable transistor technology having both sufficient speed (i.e., sufficiently high gain cutoff frequency, $F_t$), and sufficiently high breakdown voltage (BV).

Certain non-silicon devices, such as group III-nitride (III-N) devices, offer a promising avenue for integration of PMIC and RFIC functions as both high BV and $F_t$ can be obtained. For such devices, an asymmetric high electron mobility transistor (HEMT) structure where device length between the source and gate ($L_{sg}$) is different than device length between the gate and drain ($L_{gd}$) may enable a particularly high BV with a low on-state source-to-drain resistance ($R_{ON}$). A while the shorter $L_{sg}$ enables a low $R_{ON}$, a longer $L_{gd}$ enables a high BY. However, these two device dimensions need to be precisely defined for the devices to be manufacturable in high volume. To date, no technique exists to repeatedly define these device dimensions to different values. Conventional methods rely on alignment of two or more lithographic mask patterning operations and such techniques suffer from high variation of $L_{gd}$ and $L_{sg}$ dimensions due to inter-mask alignment tolerances/errors.

Enhancement mode operation also remains a challenge for III-N HEMT devices with thresholds in most designs being less than zero (i.e., depletion mode). Large scale integration of III-N HEMTs thus poses power consumption concerns. Conventional threshold adjustment techniques typically rely on gate recess etches (e.g., single or double recess), but limited etch selectivity may make such techniques unsuitable for high volume manufacturing.

BRIEF DESCRIPTION OF THE DRAWINGS

Embodiments of the present invention are illustrated by way of example, and not by way of limitation, and can be more fully understood with reference to the following detailed description when considered in connection with the figures, in which.

DETAILED DESCRIPTION

Figure 1:
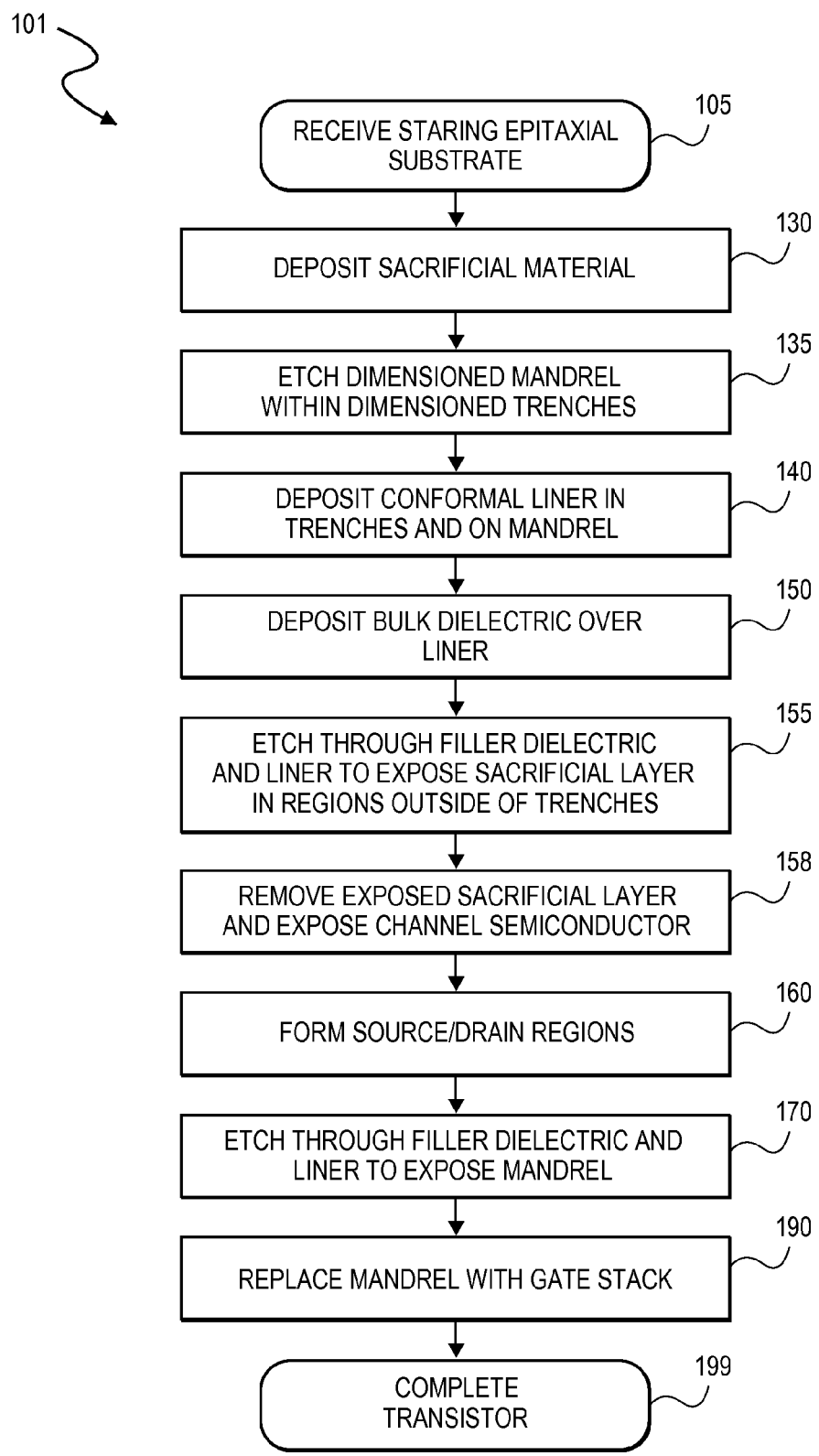
FIG. 1 is a flow diagram illustrating a method of fabricating an asymmetric III-N HEMT, in accordance with embodiments.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Described herein are group III-nitride (III-N) high electron mobility transistors (HEMT), and more specifically metal-oxide-semiconductor HEMTs (MOSHEMTs). In embodiments, a gate electrode is spaced apart by different distances from a source and drain semiconductor region to provide high breakdown voltage and low on-state resistance. In embodiments, self-alignment techniques are applied to form a dielectric liner in trenches and over an intervening mandrel to independently define a gate length, gate-source length, and gate-drain length with a single critical masking operation. In embodiments, III-N HEMTs include fluorine doped semiconductor barrier layers for threshold voltage ($V_t$) tuning and/or enhancement mode operation. In embodiments, asymmetric and/or enhancement mode III-N HEMTs are employed in SoC solutions integrating an RFIC with a PMIC to implement high voltage and/or high power circuits. With HEMT embodiments described herein, SoC solutions may deliver the product specific electrical current and power requirements needed for a mobile computing platform. The fast switching, high voltage III-N transistors are capable of handling high input voltage swings and providing high power added efficiencies at RF frequencies. In embodiments, the III-N asymmetric and/or enhancement mode HEMTs are amenable to monolithic integration with group IV transistor architectures, such as planar and non-planar silicon CMOS transistor technologies. In particular embodiments, group III-N transistors are employed in SoC architectures integrating high power wireless data transmission and/or high voltage power management functions with low power CMOS logic data processing. High frequency operation suitable for broadband wireless data transmission applications is possible while the use of large band gap III-N materials also provides a high BV such that sufficient RF output power may be generated for the wireless data transmission applications. This combination of high $F_t/F_{max}$ and high voltage capability also renders the transistors described herein suitable for high speed switching applications in DC-to-DC converters utilizing inductive elements of reduced size. As both the power amplification and DC-to-DC switching applications are key functional blocks in smart phones, tablets, and other mobile platforms, the structures described herein may be utilized in a SoC solution for such devices.

FIG. 1 is a flow diagram illustrating a method 101 for fabricating an asymmetric III-N HEMT, in accordance with embodiments. FIGS. 2A, 2B, 2C, 2D, 2E, 2F, 2G, 2H, 2I, and 2J illustrates a cross-section of an asymmetric III-N HEMT as it evolves as a result of the performances of operations in the method 101, in accordance with embodiments. Description of the method 101 and corresponding transistor structures are described in reference to the FIGS. 1 and 2A-2J concurrently for clarity of description.

The method 101 exemplifies a technique for independently defining three important dimensions of a transistor: the gate length ($L_g$), gate-source length ($L_{gs}$), and gate-drain length ($L_{gd}$) with a single critical masking operation with other masking operations rendered non-critical because overlay tolerances are greatly relaxed through self-alignment techniques. Therefore good control over ($L_g$), ($L_{gs}$), and ($L_{gd}$) can be maintained in a high volume manufacturing environment. The method 101 further exemplifies a technique for adjusting threshold voltage in a manner conducive to enhancement mode operation.

Figure 2A:
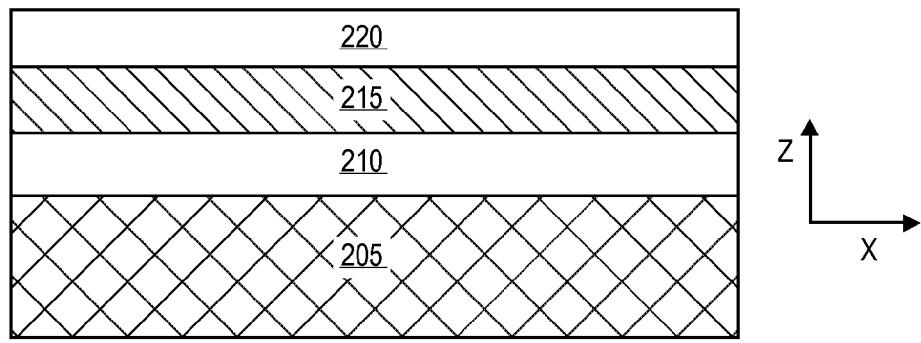
FIGS. 2A, 2B, 2C, 2D, 2E, 2F, 2G, 2H, 2I, and 2J illustrates a cross-section of an asymmetric III-N HEMT as it evolves as a result of the performance of operations in the method depicted in FIG. 1, in accordance with embodiments.

The method 101 begins with receipt of a starting substrate at operation 105. FIG. 2A illustrates a cross-section of an exemplary III-N semiconductor starting material 201 in which a high electron mobility transistor (HEMT) may be formed, in accordance with embodiments. At the base of the starting material 201 is a substrate 205. Generally, the substrate 205 is a non-III-N material such that the starting material 201 includes metamorphic epitaxial layers. The substrate 205 may therefore be any known in the art application to III-N material stacks, such as, but not limited to: SiC, sapphire, silicon, silicon alloys, and III-V materials and their alloys. In one exemplary embodiment, the substrate 205 is crystalline silicon (e.g., substantially monocrystalline). In first silicon substrate embodiments, the substrate 205 is (100) silicon (i.e., having a (100) top surface upon which overlying epitaxial layers are disposed). The (100) crystal orientations are advantageous for the formation of silicon transistors (e.g., in other regions not covered by III-N epitaxial layers) and therefore advantageous for embodiments where a group III-N transistor formed in the starting material 201 is to be monolithically integrated with silicon CMOS transistor technology. In second silicon substrate embodiments, the substrate 205 is (111) silicon (i.e., having a (111) top surface upon which overlying epitaxial layers are disposed). Although the exemplary (100) and (111) silicon embodiments entail substrates consisting essentially of silicon, some level of impurities not detrimental to III-N and/or silicon CMOS device function are permissible.

In embodiments, a starting substrate includes a buffer. Generally, the buffer is to transition between the characteristics of an underlying substrate material (e.g., silicon, sapphire, SiC, etc.) and overlying III-N device layers. As such, the buffer may be of any composition, number of layers, thickness, etc. known in the art to be suitable for the particular substrate. In the exemplary embodiment illustrated in FIG. 2A, the buffer layer 210 is of a III-N material.

In embodiments, a starting material includes at least one III-N device layer. In the exemplary embodiment illustrated in FIG. 2A, a channel layer 215 and a top barrier layer 220 represent device layers disposed over the buffer layer 210. In embodiments, the channel layer 215 is substantially single crystalline and although is referred to herein as "monocrystalline," one of ordinary skill will appreciate that a low level of crystal defects may nevertheless be present as artifacts of an imperfect epitaxial growth processes. Within the channel layer 215, there is a crystalline arrangement of a first semiconductor material including one or more group III elements and nitrogen. Generally, the group III-nitride semiconductor in the channel layer 215 should have relatively high carrier mobility and therefore in embodiments, the channel layer 215 is substantially undoped group III-nitride material (i.e., impurity concentration minimized) for minimal impurity scattering. In the exemplary embodiment, the channel layer 215 is GaN. However, the channel layer 215 may also be one or more ternary alloy of GaN, such as AlGaN, AlInN, or a quaternary alloy of GaN including at least one group III element and nitrogen, such as $In_xAl_yGa_{1-x-y}N$. In one exemplary GaN embodiment, the channel layer 215 is between 10 nm and 200 nm in thickness (z-dimension).

In embodiments, a starting material includes a cap or semiconductor barrier layer disposed over the channel layer. Generally, any group III-N material known in the art may be utilized for the barrier layer, as dependent on the material selected for the channel layer such that the barrier layer has the ability to induce a sheet charge within the channel layer. In embodiments, the barrier layer has a larger band gap than that of the channel layer. Preferably, barrier layer is substantially monocrystalline (e.g., having a thickness below the critical thickness for the given composition or lattice matched to the group III-N material utilized in the channel layer). In the exemplary embodiment illustrated in FIG. 2A, the barrier layer 220 includes a second group III-N material layer having the same crystallinity as that of the channel layer 215 to form a hetero-interface. In a first exemplary embodiment where the channel layer 215 is GaN, the top barrier layer 220 is $Al_zGa_{1-z}N$, $Al_wIn_{1-w}N$, AlN, or a quarternary of AlInGaN. One exemplary top barrier layer 220 has 18% In. In embodiments, the barrier layer 220 has only intrinsic impurity doping level (e.g., $i-Al_wIn_{1-w}N$). Quaternary alloys including at least one group III element and nitrogen, such as $In_xAl_yGa_{1-x-y}N$, are also possible. The barrier layer 220 may further comprise a multilayer stack of group III-nitrides. For example, in one embodiment the barrier layer 220 is an $Al_wIn_{1-w}N$/AlN stack with the AlN layer of the stack adjacent to channel layer 215 to serve as a charge inducing layer. In certain embodiments, the barrier layer 220 is between 1 nm and 5 nm in thickness.

Returning to FIG. 1, at operation 130 a sacrificial material is deposited over the starting substrate. Generally, the sacrificial material may be any that can be patterned with high fidelity (e.g., good sidewall smoothness and sidewall angle control). In the exemplary embodiment, the sacrificial material is a dielectric, such as silicon dioxide, or silicon nitride, deposited for example by chemical vapor deposition (CVD), plasma enhanced CVD (PECVD), ALD or other conventional means. In other embodiments, the sacrificial material is polycrystalline or amorphous silicon. The sacrificial material may also comprise a stack of materials, for example a pad material (e.g., $SiO_2$) may be deposited on the starting substrate surface (e.g., in contact with the barrier layer 220) and a bulk material (e.g., silicon nitride or poly-silicon) deposited over the pad. The thickness of the sacrificial layer may vary as needed to ensure reasonable aspect ratios (e.g., <10:1 z-height:x-width, and preferably less than 5:1) for features subsequently etched into the sacrificial layer.

At operation 135 at least one trench is patterned into the sacrificial material with the at least one trench functioning to space a mandrel made of the sacrificial material apart from a peripheral region of the sacrificial material by a well-controlled distance. As shown in the exemplary embodiment in FIG. 2B, along one dimension (e.g., x-dimension) the transistor gate length $L_g$ is to be defined based on sizing of the mandrel 230B, while transistor source-to-gate length $L_{sg}$ is to be defined based on sizing of the trench 235 separating a first side of the mandrel 230B from the peripheral sacrificial region 230A. Similarly, the transistor drain-to-gate length $L_{gd}$ is to be defined based on sizing of the trench 236 separating a second side of the mandrel 230B, opposite the trench 235, from the peripheral sacrificial region 230C. In exemplary GaN MOSHEMT embodiments, the critical dimension (CD) of the trench 235 along the x-dimension is less than 40 nm. The CD of the trench 235 along the x-dimension may vary somewhat more as a function of the desired BV, with the trench 235 being between 40-50 nm in one exemplary GaN MOSHEMT having a BV of at least 10 V, and 80-100 nm for another embodiment having a BV of at least 20V. The CD of the mandrel 230B along the x-dimension may also vary, with exemplary embodiments being between 20 and 100 nm.

Figure 2B:
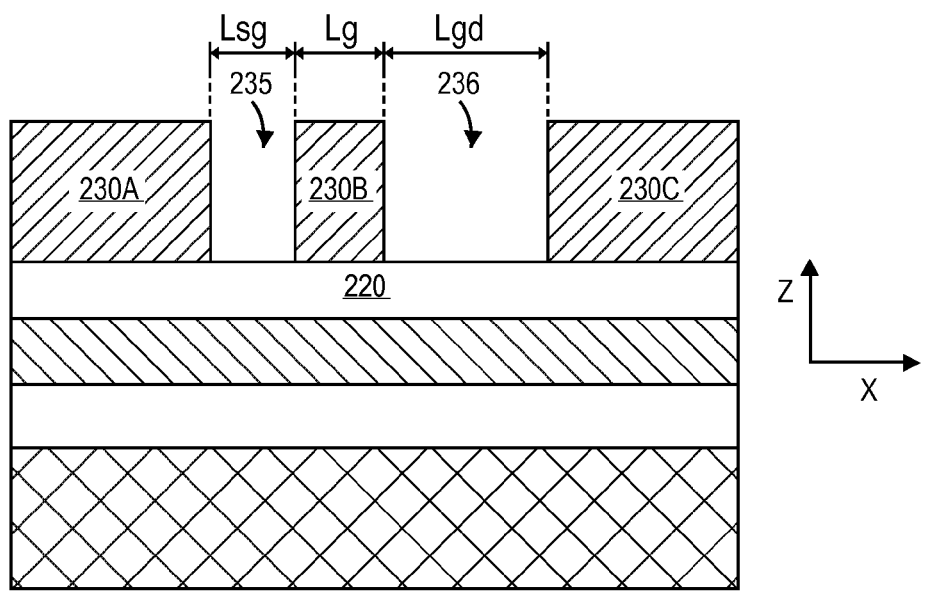

Notably, the trenches 235, 236 may be a single trench joined together in region out of the plane of the FIG. 2B (e.g., forming a moat completely surrounding the mandrel 230B), or the trenches 235, 236 may be separate polygons of a same mask defining openings or spaces with the mandrel 230B an intervening line. In embodiments, the trenches 235, 236 clear the sacrificial material and expose the underlying semiconductor (e.g., barrier layer 220). Of further note is that the operation 135 entails only a single lithographic masking operation followed by any suitable anisotropic etch of the sacrificial material known.

Figure 2C:
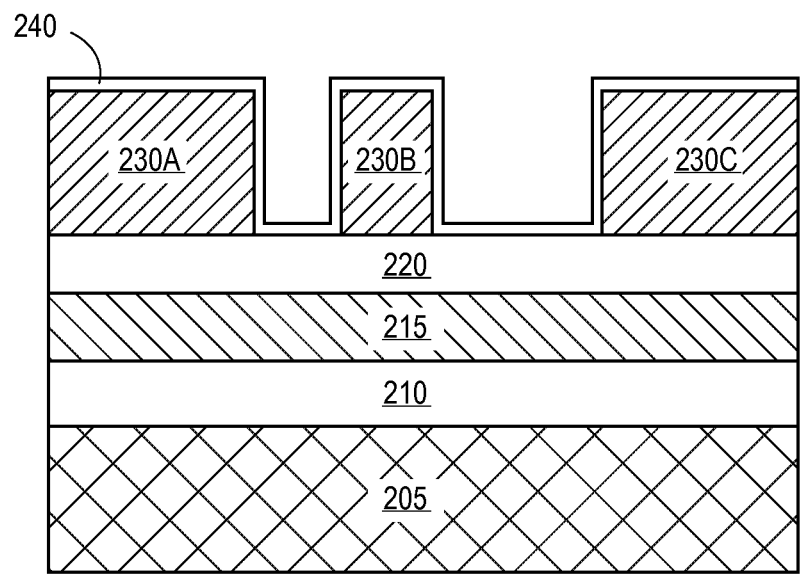

Returning to FIG. 1, the method 101 proceeds to operation 140 where a dielectric liner is conformally deposited into the trenches and over the sacrificial mandrel. The dielectric liner 240 is depicted in FIG. 2C for the exemplary embodiment illustrated in FIG. 2C. Generally, the dielectric liner is to serve as a self-alignment structure, and/or lateral etch stop, and is to be of a composition that offers good etch selectivity relative to the sacrificial material (i.e., sacrificial material is etchable at a higher rate than the dielectric liner). The dielectric liner is also advantageously a highly conformal layer and relatively thin. In one advantageous embodiment the dielectric liner is deposited with an atomic layer deposition (ALD) process. In certain such embodiments, the dielectric liner 240 is a high-k dielectric including a metal-oxide, such as, but not limited to $HfO_2$, $HfSiO_x$, $ZrO_2$, $ZrSiO_x$, $Al_2O_3$, and $AlSiO_x$. While the thickness of the dielectric liner 240 may vary, in exemplary ALD embodiments, the thickness is between 2-3 nm.

Figure 2D:
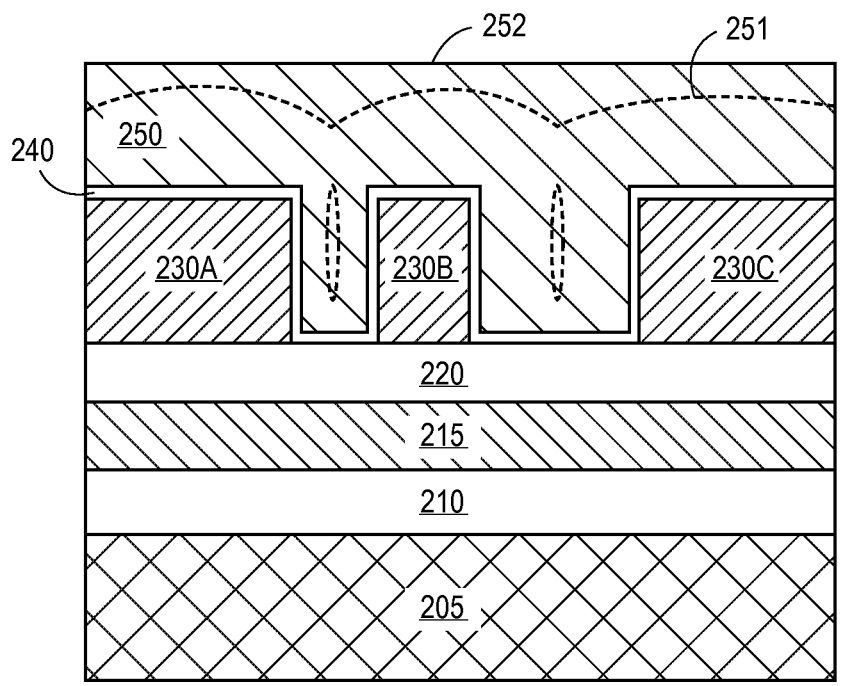

Continuing with FIG. 1, the method 101 advances to operation 150 where a filler dielectric is deposited over the dielectric liner. Generally, the filler dielectric is to fill the trenches in preparation of a subsequent lithography (non-critical) operation. The filler dielectric is preferably of a material resistant to the etchant of the sacrificial material. As illustrated in FIG. 2D, the filler dielectric material 250 may either have a planarized top surface 252 or a key-holed, cusped surface 251, depending on the materials and techniques employed at operation 150. Any deposition technique known, such as, but not limited to, CVD, PECVD, and flowable oxide, may be employed to form the filler dielectric material 250. In one advantageous embodiment where the sacrificial material 230A,B,C is silicon dioxide, the filler dielectric material 250 is silicon nitride, which offers good selectivity to oxide etchants. In another advantageous embodiment wherein the sacrificial material 230A,B,C is silicon nitride or silicon (polycrystalline or amorphous), the filler dielectric material 250 is silicon dioxide, which offers good selectivity to silicon and silicon nitride etchants. In other advantageous embodiments, the filler dielectric material 250 is a conventional low-k (below 3) or ultra low-k (below 2) material. The thickness of the filler dielectric material 250 depends on the depth of the trenches 235, 236, as well as the planarization and/or gap fill capability. In exemplary embodiments, the thickness is one or two orders of magnitude greater than that of the dielectric liner 240.

Figure 2E:
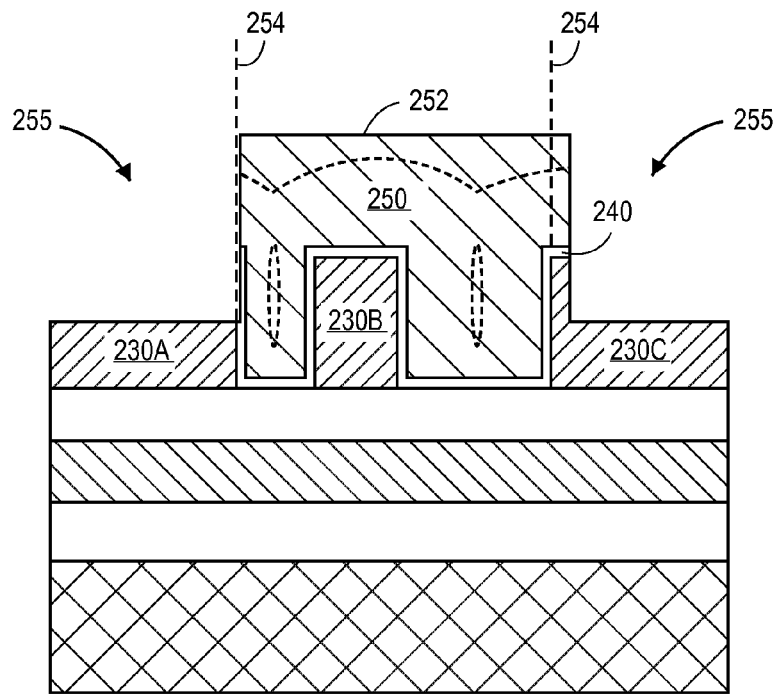

Returning to FIG. 1, the method 101 continues at operation 155 where the bulk dielectric and dielectric liner is patterned by etching through the films to expose the sacrificial material disposed below in the peripheral regions outside of the trenches that were formed in the sacrificial material at operation 135. Generally, any conventional photolithographic patterning process may be employed to form a protective masking layer over a portion of the filler dielectric that is not to be removed. Because underlying topographies and materials will serve to control dimensioning in a self-aligned manner, masking at operation 155 is non-critical, and significant misregistration of etched features relative to the ideal feature edges 254 is depicted in FIG. 2E to emphasize this point. As shown in FIG. 2E, the peripheral sacrificial regions 230A and 230C are exposed and/or recessed by an anisotropic etch 255 performed at operation 155. Any dry plasma etch known in the art may be utilized to provide reasonable pattern fidelity in the etching of the particular bulk dielectric and dielectric liner materials.

Figure 2F:
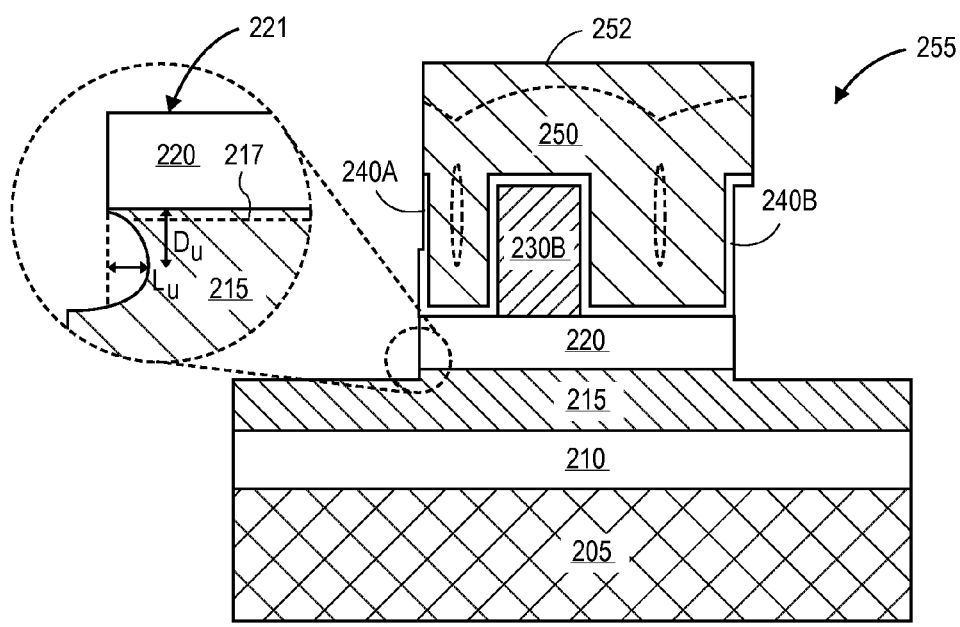
Figure 2G:
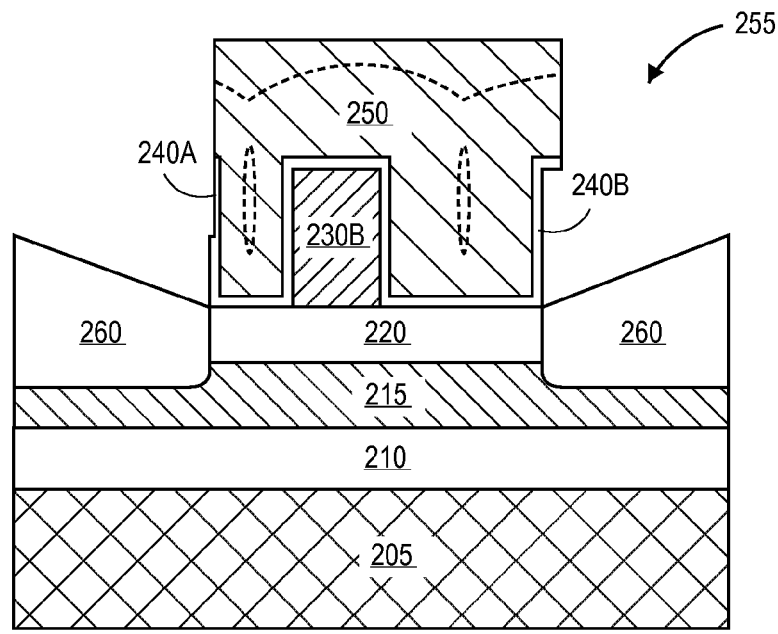
Figure 2H:
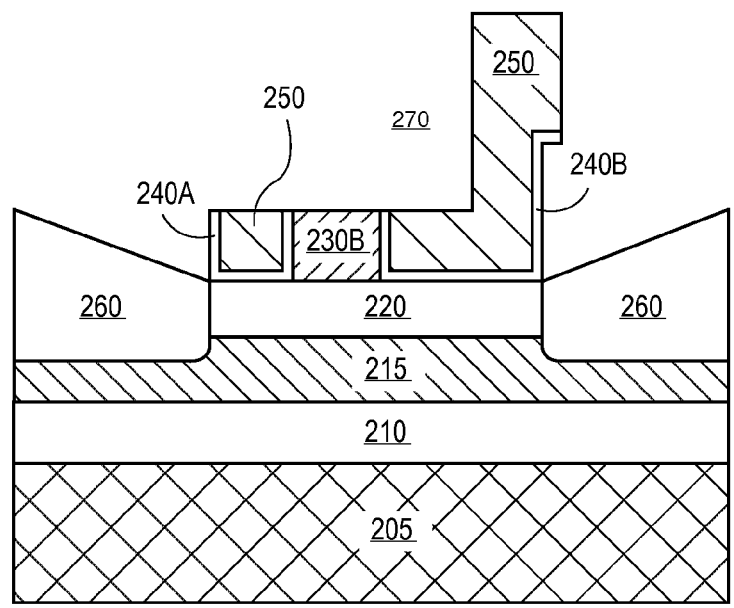
Figure 2I:
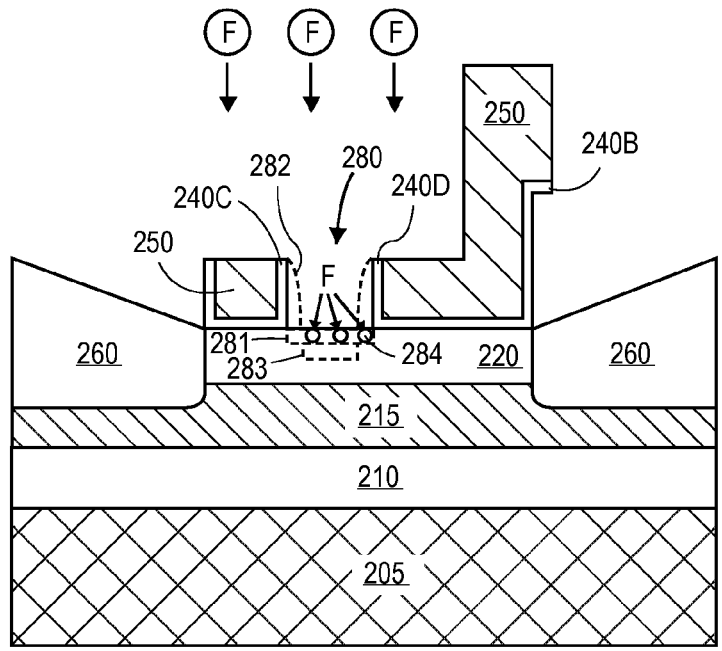

Proceeding with the method 101, operation 158 entails removing the exposed sacrificial material in a manner that will expose the dielectric liner, without removing it, to expose a desired amount of underlying channel semiconductor. In advantageous embodiments, an isotropic etch is employed to etch through the exposed sacrificial material and to stop on at least the dielectric liner, and advantageously also stop on the filler dielectric. Referring to FIG. 2F, in the exemplary embodiment a wet etch and/or isotropic plasma etch process selective to both the dielectric liner 240 and filler dielectric material 250 is employed to laterally and vertically etch the peripheral sacrificial material 230A, 230C and expose the underlying barrier layer 220 in self-alignment with the outer sidewalls of the trenches 235, 236 defined by the dielectric sidewall liners 240A, 240B serving as lateral etch stops. The operation 158 then continues with an anisotropic etch of the exposed surfaces 221 of the barrier layer 220 to expose a surface of the channel layer 215, again with an etched barrier layer feature edge precisely controlled relative to the dielectric liner sidewalls 240A, 240B aligned with the outer sidewalls of the trenches 235, 236.

In certain embodiments of operation 158, as further illustrated in FIG. 2F, a top surface of the channel layer 215 is recessed to remove a top thickness of the channel layer 215. Such recessing of the channel layer surface may provide advantageously lower resistance between a subsequently formed heavily doped source and drain semiconductor and the region of the channel layer 215 where the sheet charge resides. In certain embodiments, the surface of the channel layer 215 is recessed between 2 and 20 nm from the interface of the barrier layer 220. As further illustrated in the expanded view inset of FIG. 2F, the channel layer 215 may be isotropically and/or crystallographically etched, for example with wet chemical etchant to undercut the sheet charge region (e.g., top 2-3 nm of the channel layer 215 where the 2 DEG 217 resides) with a maximum undercut being less than 10 nm and more particularly less than 5 nm in certain GaN channel layer embodiments where the barrier layer 220 includes an AlN layer in contact with the GaN channel layer. As shown, undercut of the channel layer 215 may be nearly nil at the interface of the barrier layer 220 (e.g., as a result of slight intermixing at the interface) and maximal at a depth of 3-5 nm from the barrier layer interface such that highly doped source/drain regions backfilling the undercut can be better coupled to the 2D electron gas within channel layer 215 and offer relatively lower resistance than might otherwise be achieved.

Continuing with FIG. 1, at operation 160 highly-doped source semiconductor and drain semiconductor regions are deposited or epitaxially grown. In the exemplary embodiment illustrated in FIG. 2G, the source/drain semiconductor regions 260 have inner edges precisely disposed relative to the trench sidewalls, and more particularly relative to the dielectric sidewall liners 240A, 240B disposed on the outer trench sidewalls. Generally, the source/drain semiconductor regions 260 may comprise any semiconductor material known in the art to provide good source/drain function for the channel layer 215. For GaN channel layers, n-type doped III-N materials, such as one or more of GaN, InGaN, or InN may be utilized for the source/drain semiconductor regions 260. In one exemplary embodiment where the channel layer 215 is GaN, the source/drain semiconductor regions 260 comprise InGaN with n-type doping levels of at least 1e19 $cm^{-3}$ and up to 2e20 $cm^{-3}$.

In further reference to FIG. 1, at operation 170 the filler dielectric layer and dielectric liner are again etched, this time to expose the sacrificial mandrel 230B. Any conventional techniques, such as, but not limited to, patterned etching, and/or blanket etch back, and/or polishing may be employed. In the exemplary embodiment illustrated in FIG. 2H, a lithographic mask is patterned to have an open region disposed over the sacrificial mandrel 230B. Again, such a masking can be patterned as a noncritical layer with relaxed CD and overlay tolerances in reliance of the underlying topography and distinct material compositions. A timed anisotropic etch, for example substantially like that performed at operation 155, is performed at operation 170 to etch a recess 270 having a bottom that exposes a surface of the sacrificial mandrel 230.

At operation 190, the exposed sacrificial mandrel is replaced with a gate stack. In the exemplary embodiment illustrated in FIG. 2I, a dry and/or wet isotropic etch of the sacrificial mandrel 230B is performed, for example using an etch process substantially the same as that employed at operation 158. The etchant, for example a wet etchant, has high selectivity to both the semiconductor barrier layer 220 and the dielectric liner 240 such that the dielectric sidewall liners 240C, 240D disposed along the inner sidewalls of the trenches 235, 236 serve as lateral etch stops defining the length of the trench 280 along the x-dimension (e.g., $L_g$). In further embodiments, one or more gate recess etches may be performed to recess the barrier layer 220 exposed at the bottom of the trench 280 formed between the dielectric liners 240C, 240D after the sacrificial mandrel 230B is removed. Depending on the embodiment, the recessed barrier thickness may be 0%-50% of an unrecessed thickness. Such thinning of the top barrier layer 220 helps achieve enhancement mode as the spontaneous and piezoelectric polarization induced charges in the channel layer disposed below a gate electrode can be depleted, increasing $V_t$. A single gate recess embodiment is depicted by dashed line 281. In double recess embodiments, after a spacer dielectric and anisotropic etch process is performed to form a spacer (dashed line 282) along the interior of the dielectric liners 240C, 240D, a second recess etch (dashed line 283) may be performed.

In embodiments, at least a portion of a semiconductor barrier layer is fluorine doped. It has been found by the inventors that fluorine doping of the barrier layer has an impact on transistor threshold voltages ($V_t$). More particularly, the presence of fluorine dopant in the barrier layer has been found to add a controllable amount of fixed (negative) charge which can, if in sufficient quantity, render a III-N (MOS)HEMT operable in the enhancement mode (Vt>0). In the exemplary embodiment illustrated in FIG. 2I, the barrier layer 220 exposed at the bottom of the trench 280 is directly doped with fluorine 284. Notably, direct doping of the barrier layer permits a well controlled and potentially high dopant concentration. While the optimal barrier doping concentration is dependent on a number of factors (e.g., gate metal work function, etc.) and therefore can vary considerably with implementation, in exemplary embodiments, the fluorine doping concentration is at least 1e17 $cm^{-3}$ and may be as high as 7e19 $cm^{-3}$. In embodiments with an exemplary GaN channel HEMT with an AlN/InAlN stacked barrier layer, a fluorine doping range is between 1e17 $cm^{-3}$ and 1e18 $cm^{-3}$ enables enhancement mode operation.

With the trench 280 serving as a means of self-aligning the fluorine doping of the barrier layer 220, the direct doping technique can be implemented with low cost. Direct fluorine doping of regions of the barrier layer may be done in a number of manners. In one embodiment, fluorine (e.g., isotope F22) is implanted into the barrier layer 220. In another embodiment, a surface of the barrier layer 220 is exposed to a plasma of a fluorinated source gas, such as, but not limited to, $SF_6$, which has been found not to etch N+ doped GaN, and therefore not expected to pose any issue for the source/drain semiconductor regions 260 if they are also exposed. Low energy plasma, such as those with downstream sources may be particularly advantageous for plasma-based fluorine doping of the barrier layer 220. Where the N-doped region is extremely highly doped (which is true in our case) the fluorine will not degrade the contact resistance. However, in other embodiments where the S/D regions comprise more lightly doped materials, because a fluorine implant could adversely affect the S/D regions and increase the ohmic contact resistance to the channel, the fluorine implant is performed after S/D metal contact deposition (which would be covering the III-N doped S/D regions).

Notably, either or both gate recess etching and fluorine barrier doping may be utilized as transistor $V_t$ adjustment techniques. Although gate recess etching is employed in certain embodiments, in some embodiments where control over the gate recess depth may be particularly challenging (e.g., where the barrier layer 220 is of a homogeneous material or a stack of materials offering insufficient etch selectivity for a base layer to serve as an etch stop), fluorine doping may be utilized in the absence of gate recess etching. Notably, in certain embodiments, removal of the sacrificial mandrel 230B is performed for a first transistor prior to a second transistor (e.g., with successive masking operations) and fluorine doping performed after forming the trench 280 in the first transistor, but before forming the trench 280 in the second transistor to arrive at different threshold voltages for two HEMT devices on a same substrate (e.g., an enhancement and a depletion device, or two enhancement devices with different thresholds, etc.).

Figure 2J:
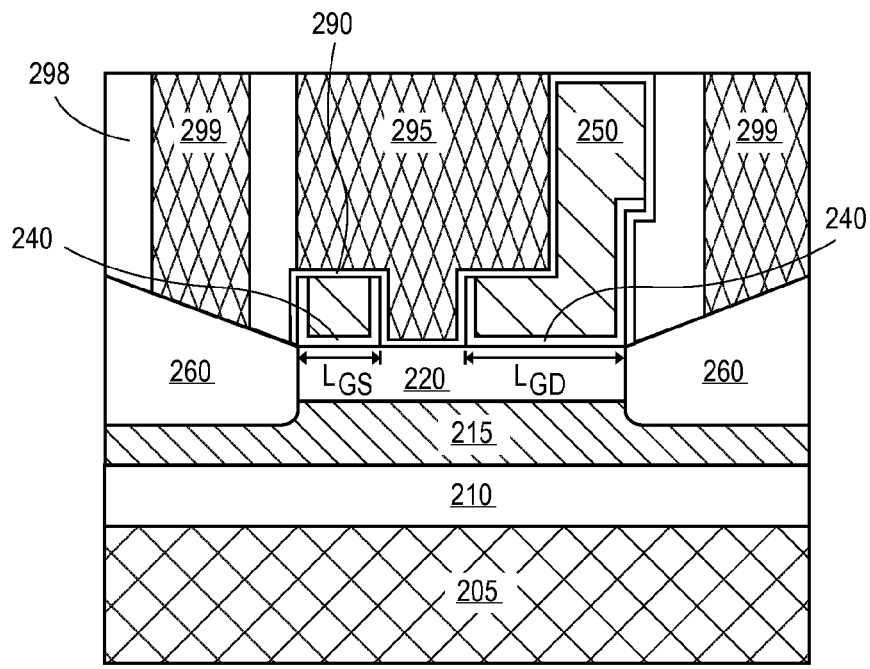

With the barrier layer 220 conditioned, operation 190 proceeds with depositing the gate stack. Generally, the gate stack includes at least one gate dielectric material layer disposed over the channel layer (e.g., in contact with a barrier layer) and at least one gate electrode material layer. FIG. 2J illustrates one exemplary embodiment where the gate dielectric 290 is disposed on the barrier layer 220 and a gate electrode 295 is disposed on the gate dielectric 290. In an embodiment, the gate electrode 295 includes a large work function metal to increase the $V_t$. A work function metal which may be selected to obtain a desired threshold voltage ($V_t$) (e.g., greater than 0V, etc) with exemplary conductive gate materials include, tungsten (W), aluminum (Al), titanium (Ti), tantalum (Ta), nickel (Ni), molybdenum (Mo), germanium (Ge), platinum (Pt), gold (Au), ruthenium (Ru), palladium (Pd), iridium (Ir), their alloys and silicides, carbides, nitrides, phosphides, and carbonitrides thereof. One or more layer of the gate electrode 295 may be sputter deposited or conformally deposited (e.g., by ALD).

In the embodiment illustrated in FIG. 2J, the gate dielectric 290 serves as both a gate dielectric and a spacer dielectric, laterally separating the gate electrode 295 from the source and drain 260. Because the gate dielectric 290 is a self-aligned, ultra-scaling of $L_{gs}$ is achievable based on the dimensioning of the trench 235 (e.g., at operation 135) to reduce the $R_{on}$ of the transistor. Deposition of the dielectric within the trench 280 may also enable scaling of the transistor channel length ($L_g$) to dimensions smaller than lithographically definable feature sizes. Dielectrics materials such silicon nitrides ($Si_xN$), silicon oxide ($SiO_2$), alumina ($Al_2O_3$) and high-k dielectrics such as $Gd_2O_3$, $HfO_2$, high-K silicates such as HfOSiO, TaSiO, AlSiO, and high-K oxynitrides such as HfON, SiON, AlON, ZrSiON, HfSiON, and group III-ON are suitable for the gate dielectric 290. In embodiments, high quality passivation of the underlying semiconductor is achieved by depositing a high-k dielectric material by ALD. In the exemplary embodiment illustrated, because of the conformal nature of ALD deposition, a gate dielectric layer is disposed directly on the outer liner sidewalls 240A, 240B as well, advantageously encapsulating the filler dielectric material 250.

In embodiments, the gate dielectric layer (e.g., 290 in FIG. 2J) is a multi-layered stack of materials. Such a stack may be particularly advantageous for embodiments having fluorine doped semiconductor barrier layers because it has been found that outdiffusion of fluorine ions from the III-N semiconductor surface can occur during deposition of certain high-k dielectrics where the deposition process temperature is relatively high (e.g., 350° C.). Therefore, in one advantageous embodiment, a base dielectric layer is deposited onto the barrier layer surface at a low temperature (e.g., 200° C., or lower) and then a top dielectric layer is deposited onto the base dielectric layer at a higher temperature (e.g., 350° C.) to complete the gate dielectric (e.g., 290 in FIG. 2J). A suitable base layer composition may be chosen in view of the low temperature constraint. Because the base dielectric layer is deposited at a low temperature, the composition may not offer the best combination of desired properties with respect to gate dielectrics in general. Therefore, the top dielectric layer deposited at a higher temperature and of a different composition (e.g. $HfO_2$) than the base dielectric layer, may augment the base layer's function of limiting outdiffusion of fluorine to combine for a robust gate dielectric stack.

Returning to FIG. 1, the method 101 at operation 199 then completes the transistor using any techniques conventional to HEMT manufacture, or any transistor fabrication more generally. For example, as shown in FIG. 2J, contact metallization 299 to the source/drain semiconductor regions 260 may be formed, as well as interlayer dielectric (ILD) 298, as known in the art. Hence, FIG. 2J illustrates a cross-section of a substantially complete group III-N transistor, possessing the structural features previously described as the method 101 evolved the structures, in accordance with an embodiment. Notably, in further embodiments where CMOS transistors are also formed in the same starting material, one or more of the operations in method 101 may be concurrently or selectively performed (e.g., using conventional masking techniques) to silicon CMOS regions and HEMT regions of the substrate.

Figure 3:
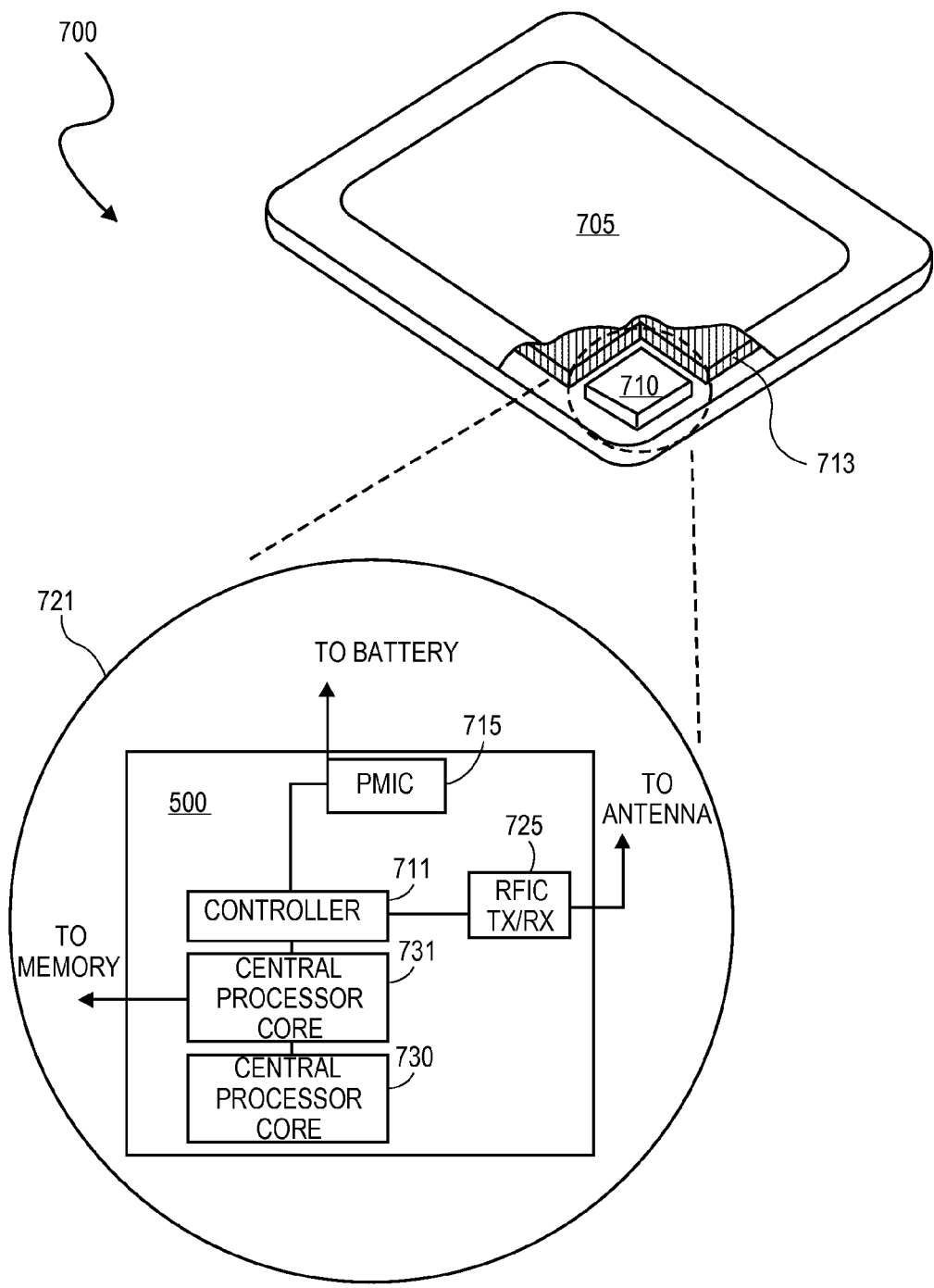
FIG. 3 illustrates an isometric view of a mobile computing device platform and schematic view of a microelectronic device employed by the mobile platform, in accordance with one embodiment of the present invention.

FIG. 3 is a functional block diagram of a SoC implementation of a mobile computing platform, in accordance with an embodiment of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705 that is in the exemplary embodiment a touchscreen (e.g., capacitive, inductive, resistive, etc.) permitting the receipt of user input, the SoC 710, and a battery 713. As illustrated, the greater the level of integration of the SoC 710, the more of the form factor within the mobile computing platform 700 that may be occupied by the battery 713 for longest operative lifetimes between charging, or occupied by memory (not depicted), such as a solid state drive, for greatest functionality.

Depending on its applications, mobile computing platform 700 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The SoC 710 is further illustrated in the expanded view 721. Depending on the embodiment, the SoC 710 includes a portion of a substrate 500 (i.e., a semiconductor chip) upon which two or more of a power management integrated circuit (PMIC) 715, RF integrated circuit (RFIC) 725 including an RF transmitter and/or receiver, a controller thereof 711, and one or more central processor core 730, 731 is fabricated. The RFIC 725 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The RFIC platform 725 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively outside of the PMIC 715 and RFIC 725. In embodiments of the present invention, the PMIC 715 and RFIC 725 employ one or more of the group III-nitride transistors as described herein (e.g., group III-nitride transistor 201) utilizing one or more of an asymmetric architecture, and fluorine doped barrier layer, as described herein. Through the ability to operate in enhancement mode, power savings is enabled by fluorine doping embodiments described herein. In further embodiments the PMIC 715 and RFIC 725 employing the group III-nitride transistors described herein are integrated with one or more of the controller 711 and processor cores 730, 731 provided in silicon CMOS technology monolithically integrated with the PMIC 715 and/or RFIC 725 onto the (silicon) substrate 205. It will be appreciated that within the PMIC 715 and/or RFIC 725, the high voltage, high frequency capable group III-nitride transistors described herein need not be utilized in exclusion to CMOS, but rather silicon CMOS may be further included in each of the PMIC 715 and RFIC 725.

The group III-nitride transistors described herein may be specifically utilized where a high voltage swings present (e.g., 7-10V battery power regulation, DC-to-DC conversion, etc. within the PMIC 715). As illustrated, in the exemplary embodiment the PMIC 715 has an input coupled to the battery 713 and has an output provide a current supply to all the other functional modules in the SoC 710. In a further embodiment, where additional ICs are provided within the mobile computing platform 700 but off the SoC 710, the PMIC 715 output further provides a current supply to all these additional ICs off the SoC 710. With the reduced on-state resistance available (e.g., through the asymmetric $L_{gd}/L_{gs}$) and low access resistance, particular embodiments of the group III-nitride transistors described herein permit the PMIC to operate at higher frequencies (e.g., 50× those possible in LDMOS implementations). In certain such embodiments, inductive elements within the PMIC (e.g., buck-boost convertors, etc.) may be scaled to much smaller dimensions. As such inductive elements in the PMIC account for 60-70% of chip area, embodiments of the PMIC implemented in the group III-nitride transistors described herein offer a significant shrink over other PMIC architectures.

As further illustrated, in the exemplary embodiment the RFIC 715 has an output coupled to an antenna and may further have an input coupled to a communication module on the SoC 710, such as an RF analog and digital baseband module (not depicted). Alternatively, such communication modules may be provided on an IC off-chip from the SoC 710 and coupled into the SoC 710 for transmission. Depending on the group III-nitride materials utilized, the group III-nitride transistors described herein may further provide the large power added efficiency (PAE) needed from a power amplifier transistor having an $F_t$ of at least ten times carrier frequency (e.g., a 1.9 GHz in an RFIC 725 designed for 3G or GSM cellular communication).

Figure 4:
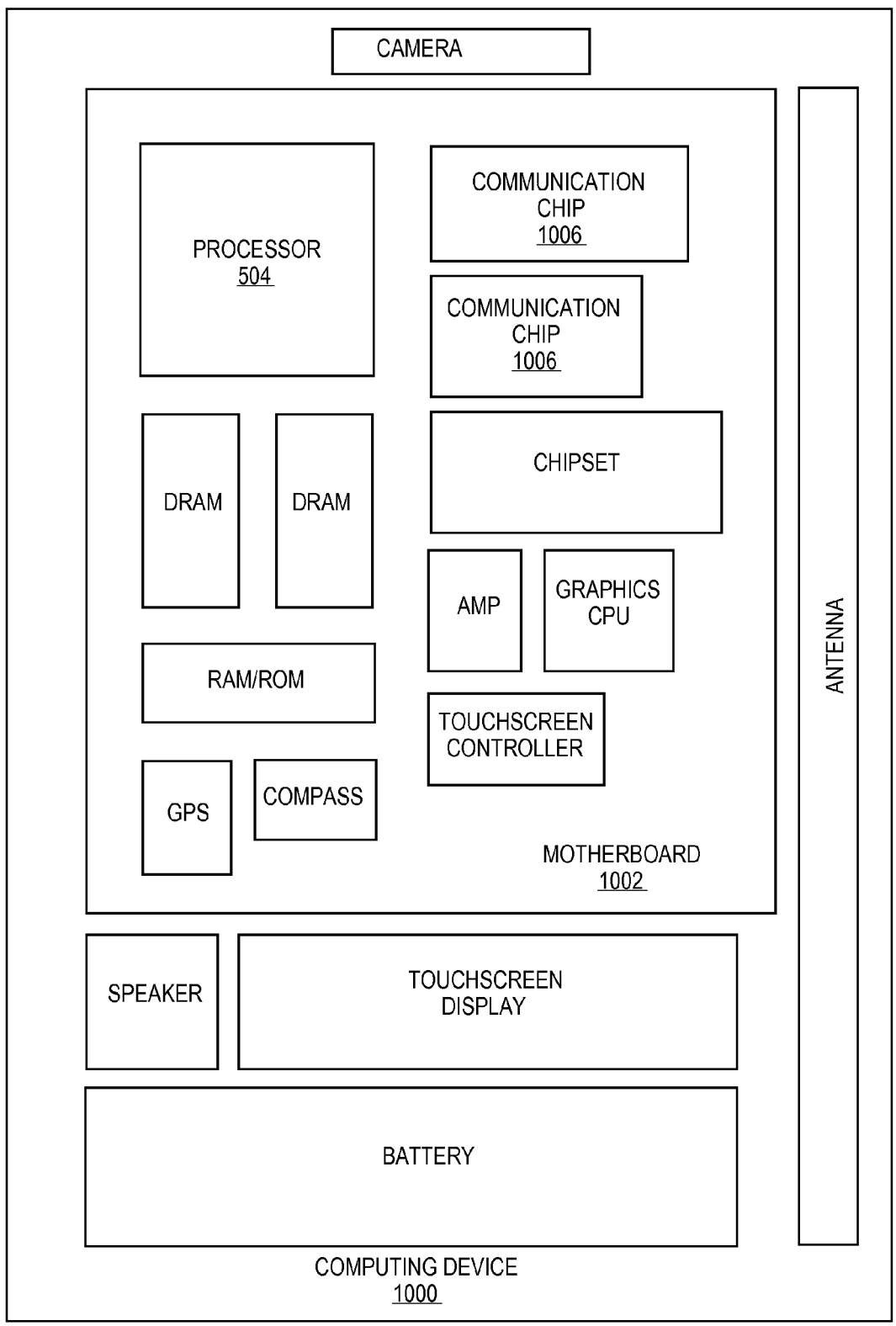
FIG. 4 illustrates a functional block diagram of computing device in accordance with one embodiment of the invention.

FIG. 4 is a functional block diagram of a computing device 1000 in accordance with one embodiment of the invention. The computing device 1000 may be found inside the platform 700, for example, and further includes a board 1002 hosting a number of components, such as but not limited to a processor 504 (e.g., an applications processor) and at least one communication chip 1006. In embodiments, at least the processor 504 is integrated (e.g., on-chip) with a III-N MOS capacitor, in accordance with embodiments describe elsewhere herein. The processor 504 is physically and electrically coupled to the board 1002. The processor 504 includes an integrated circuit die packaged within the processor 504. The term "processor" may refer to any device or portion of a device that processes electronic data from registers and/or memory to transform that electronic data into other electronic data that may be stored in registers and/or memory.

In some implementations the at least one communication chip 1006 is also physically and electrically coupled to the board 1002. In further implementations, the communication chip 1006 is part of the processor 1004. Depending on its applications, computing device 1000 may include other components that may or may not be physically and electrically coupled to the board 1002. These other components include, but are not limited to, volatile memory (e.g., DRAM), non-volatile memory (e.g., RAM or ROM) in the form of flash memory or STTM, etc., a graphics processor, a digital signal processor, a crypto processor, a chipset, an antenna, touch-screen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth).

At least one of the communication chips 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to those described elsewhere herein. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

As such, embodiments of a high electron mobility field effect transistor (HEMT) have been described. In some embodiments, a HEMT includes: a group III-N semiconductor channel layer disposed over a substrate; a gate stack disposed over a first region of the channel layer; a source region in contact with the channel layer on a first side of the gate stack; a drain region in contact with the channel layer on a second side of the gate stack opposite the source region; a dielectric liner disposed over a first length of a semiconductor barrier layer between the source region and the gate stack, and disposed over a second length of the semiconductor barrier layer between the drain region and the gate stack that is larger than the first length, wherein the dielectric liner comprises first liner sidewalls on opposite sides of the gate stack, and further comprises a second liner sidewall defining the first or second length with a filler dielectric disposed between the first liner sidewalls and the second liner sidewall.

In further embodiments, the dielectric liner further comprises a third liner sidewall defining the other of the first or second length with the filler dielectric disposed between the first liner sidewalls and the third liner sidewall. In further embodiments, the dielectric liner comprises a material having a higher dielectric constant than the filler dielectric, and wherein the gate stack further comprises a gate dielectric layer including a metal oxide that extends between the first liner sidewalls and along the entire lengths of the first liner sidewalls, and extends over the filler dielectric. In further embodiments, the gate dielectric layer is disposed directly on the second liner sidewall. In further embodiments, the source and drain regions each comprise InGaN doped n-type to at least 1e19 cm$^{-3}$. In further embodiments, the channel layer is GaN, and wherein semiconductor barrier layer comprises at least one of $Al_zGa_{1-z}N$, $Al_wIn_{1-w}N$, AlN, or a quarternary of AlInGaN. In further embodiments, a first region of the semiconductor barrier layer disposed between the gate stack and the channel layer is a lesser thickness than a second region of the semiconductor barrier layer disposed between the dielectric liner and the channel layer, or fluorine doped. In further embodiments, the first region of the semiconductor barrier layer is fluorine doped to between 1e17 cm$^{-3}$ and 1e18 cm$^{-3}$.

In embodiments, a high electron mobility transistor (HEMT), includes a gate electrode disposed between a source semiconductor region and a drain semiconductor region; a gate dielectric disposed below the gate electrode; a group III-N channel layer disposed below the gate dielectric; and a semiconductor barrier layer disposed between the channel layer and the gate dielectric, wherein the semiconductor barrier layer is fluorine doped.

In further embodiments, the semiconductor barrier layer comprises at least one of $Al_zGa_{1-z}N$, $Al_wIn_{1-w}N$, or AlN and is fluorine doped to between 1e17 cm$^{-3}$ and 1e18 cm$^{-3}$ in a first region disposed between the channel layer. In further embodiments, the gate dielectric layer further comprises: a base dielectric layer of a first composition disposed directly on the fluorine doped semiconductor barrier layer; and a top dielectric layer of a second composition disposed directly on the base dielectric layer. In further embodiments, a dielectric liner disposed over a first length of the semiconductor barrier layer between the source region and the gate dielectric, and disposed over a second length of the semiconductor barrier layer between the drain region and the gate dielectric that is larger than the first length, wherein the dielectric liner comprises first liner sidewalls on opposite sides of the gate dielectric, and further comprises a second liner sidewall defining the first or second length with a filler dielectric disposed between the first liner sidewalls and the second liner sidewall.

In embodiments, a mobile computing device, includes a touchscreen; a battery; an antenna; a DC-to-DC converter coupled to the battery; and a wireless transmitter further including a power amplifier (PA), wherein at least one of the DC-to-DC converter and the PA comprises the HEMT as described herein.

In embodiments, a method of forming an asymmetric high electron mobility transistor (HEMT), includes, depositing a sacrificial material over a substrate comprising a group III-N channel layer; etching at least one trench to form a mandrel of the sacrificial material spaced apart by a first length and a second length, different from the first, from peripheral regions of the sacrificial material; conformally depositing a dielectric liner into the at least one trench and over the mandrel; depositing a bulk dielectric over the dielectric liner to fill the at least one trench; etching through the bulk dielectric and dielectric liner to expose the peripheral regions of the sacrificial material; etching the peripheral regions of the sacrificial material selectively to the dielectric liner to expose a semiconductor channel layer disposed at the periphery of the at least one trench; forming semiconductor source and drain regions in contact with the exposed semiconductor channel layer; etching through the bulk dielectric and dielectric liner to expose the mandrel; and replacing the mandrel with a gate stack.

In further embodiments, depositing the sacrificial material further comprises depositing a dielectric, wherein conformally depositing the dielectric liner further comprises depositing a material including a metal oxide, and wherein depositing the bulk dielectric further comprises depositing a dielectric with a lower dielectric constant than that of the dielectric liner. In further embodiments, etching through the bulk dielectric and dielectric liner further comprises: masking a region encompassing the mandrel and at least a portion of the at least one trench; and anisotropically etching the bulk dielectric and dielectric liner unprotected by the masking. In further embodiments, etching the peripheral regions of the sacrificial material to expose a semiconductor channel layer further comprises: isotropically etching the sacrificial material; etching a semiconductor barrier layer disposed over the channel layer; and recessing the channel layer surface with an isotropic etch to undercut an interfacial layer of the channel layer in contact with the barrier layer. In further embodiments, forming the semiconductor source and drain regions further comprises conformally growing a heavily n-type doped III-N material with a metalorganic precursor. In further embodiments, the heavily doped III-N material comprises InGaN doped to at least 1e19 cm$^{-3}$. In further embodiments, etching through the bulk dielectric and dielectric liner to expose the mandrel further comprises anisotropically etching a portion of the bulk dielectric and dielectric liner disposed over the mandrel; and replacing the mandrel with a gate stack further comprises: etching the sacrificial material selectively to the dielectric liner to expose an underlying semiconductor layer; conformally depositing a gate dielectric layer over the channel layer and over the dielectric liner; and depositing a gate metal over the gate dielectric layer. In further embodiments, doping a semiconductor barrier layer disposed over the channel layer with fluorine by implantation or exposure to a plasma of a fluorinated source gas. In further embodiments, replacing the mandrel with a gate stack further comprises: etching the sacrificial material selectively to the dielectric liner to expose the semiconductor barrier layer; conformally depositing a base gate dielectric layer directly on the fluorine doped semiconductor barrier layer; conformally depositing a top gate dielectric layer directly on the base gate dielectric layer; and depositing a gate metal over the top gate dielectric layer.

In embodiments, a method of forming a high electron mobility transistor (HEMT) includes forming a source region and a drain region in contact with a III-N semiconductor channel region disposed over a substrate; fluorine doping a semiconductor barrier layer disposed on the channel region; depositing a gate dielectric over the barrier layer; and depositing a gate electrode over the gate dielectric. In further embodiments, the fluorine doping further comprises fluorine doping at least a portion of the barrier layer to between 1e17 and 1e18 cm$^{-3}$. In further embodiments, the fluorine doping further comprises: implanting or exposing the semiconductor barrier layer to a plasma of a fluorinated source gas. In further embodiments, the fluorine doping comprises exposing the semiconductor to a plasma of a fluorinated source gas. In further embodiments, depositing the gate dielectric further comprises: conformally depositing a base gate dielectric layer onto the barrier layer at a first temperature; and conformally depositing a top gate dielectric layer onto the base gate dielectric layer at a second temperature, higher than the first.

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A high electron mobility field effect transistor (HEMT), comprising:
a group III-N semiconductor channel layer disposed over a substrate;
a gate stack disposed over a first region of the channel layer;
a source region in contact with the channel layer on a first side of the gate stack;
a drain region in contact with the channel layer on a second side of the gate stack opposite the source region;
a dielectric liner disposed over a first length of a semiconductor barrier layer between the source region and the gate stack, and disposed over a second length of the semiconductor barrier layer between the drain region and the gate stack that is larger than the first length, wherein the dielectric liner comprises first liner sidewalls on opposite sides of the gate stack, and further comprises a second liner sidewall defining the first or second length with a filler dielectric disposed between the first liner sidewalls and the second liner sidewall.

2. The HEMT of claim 1, wherein the dielectric liner further comprises a third liner sidewall defining the other of the first or second length with the filler dielectric disposed between the first liner sidewalls and the third liner sidewall.

3. The HEMT of claim 1, wherein the dielectric liner comprises a material having a higher dielectric constant than the filler dielectric, and wherein the gate stack further comprises a gate dielectric layer including a metal oxide that extends between the first liner sidewalls and along the entire lengths of the first liner sidewalls, and extends over the filler dielectric.

4. The HEMT of claim 3, wherein the gate dielectric layer is disposed directly on the second liner sidewall.

5. The HEMT of claim 1, wherein the source and drain regions each comprise InGaN doped n-type to at least $1e19$ $cm^{-3}$.

6. The HEMT of claim 1, wherein the channel layer is GaN, and wherein semiconductor barrier layer comprises at least one of $Al_zGa_{1-z}N$, $Al_wIn_{1-w}N$, AlN, or a quarternary of AlInGaN.

7. The HEMT of claim 1, wherein a first region of the semiconductor barrier layer disposed between the gate stack and the channel layer is at least one of: a lesser thickness than a second region of the semiconductor barrier layer disposed between the dielectric liner and the channel layer, or fluorine doped.

8. The HEMT of claim 1, wherein the first region of the semiconductor barrier layer is fluorine doped to between $1e17$ $cm^{-3}$ and $1e18$ $cm^{-3}$.

9. A high electron mobility transistor (HEMT), comprising:
a gate electrode disposed between a source semiconductor region and a drain semiconductor region;
a gate dielectric disposed below the gate electrode;
a group III-N channel layer disposed below the gate dielectric; and
a semiconductor barrier layer disposed between the channel layer and the gate dielectric, wherein a portion of the group III-N channel layer is undercut beneath the semiconductor barrier layer.

10. The HEMT of claim 9, wherein the semiconductor barrier layer comprises at least one of $Al_zGa_{1-z}N$, $Al_wIn_{1-w}N$, or AlN and is fluorine doped to between $1e17$ $cm^{-3}$ and $1e18$ $cm^{-3}$ in a first region disposed between the channel layer.

11. The HEMT of claim 10, wherein the gate dielectric layer further comprises:
a base dielectric layer of a first composition disposed directly on the fluorine doped semiconductor barrier layer; and
a top dielectric layer of a second composition disposed directly on the base dielectric layer.

12. The HEMT of claim 9, further comprising a dielectric liner disposed over a first length of the semiconductor barrier layer between the source region and the gate dielectric, and disposed over a second length of the semiconductor barrier layer between the drain region and the gate dielectric that is larger than the first length, wherein the dielectric liner comprises first liner sidewalls on opposite sides of the gate dielectric, and further comprises a second liner sidewall defining the first or second length with a filler dielectric disposed between the first liner sidewalls and the second liner sidewall.

13. A mobile computing device, comprising: a touch-screen;
a battery;
an antenna;
a DC-to-DC converter coupled to the battery; and
a wireless transmitter further including a power amplifier (PA), wherein at least one of the DC-to-DC converter and the PA comprises the HEMT as in claim 1 or 9.

14. The high electron mobility transistor (HEMT) of claim 9 wherein the semiconductor barrier layer is flourine doped.

15. A high electron mobility transistor (HEMT), comprising:
a gate electrode disposed between a source semiconductor region and a drain semiconductor region;
a gate dielectric disposed below the gate electrode;
a group III-N channel layer disposed below the gate dielectric;
a semiconductor barrier layer disposed between the channel layer and the gate dielectric, wherein the semiconductor barrier layer is fluorine doped; and
a dielectric liner disposed over a first length of the semiconductor barrier layer between the source region and the gate dielectric, and disposed over a second length of the semiconductor barrier layer between the drain region and the gate dielectric that is larger than the first length, wherein the dielectric liner comprises first liner sidewalls on opposite sides of the gate dielectric, and further comprises a second liner sidewall defining the first or second length with a filler dielectric disposed between the first liner sidewalls and the second liner sidewall.

16. The HEMT of claim 15, wherein the semiconductor barrier layer comprises at least one of $Al_zGa_{1-z}N$, $Al_wIn_{1-w}N$, or AlN and is fluorine doped to between 1e17 cm$^{-3}$ and 1e18 cm$^{-3}$ in a first region disposed between the channel layer.

17. The HEMT of claim 15, wherein the gate dielectric layer further comprises:
   a base dielectric layer of a first composition disposed directly on the fluorine doped semiconductor barrier layer; and
   a top dielectric layer of a second composition disposed directly on the base dielectric layer.

* * * * *